(12) United States Patent
Park

(10) Patent No.: US 7,462,846 B2
(45) Date of Patent: Dec. 9, 2008

(54) APPARATUS FOR MEASURING A POSITION OF AN ION BEAM PROFILER AND A METHOD FOR ITS USE

(75) Inventor: Jung-Su Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 11/461,702

(22) Filed: Aug. 1, 2006

(65) Prior Publication Data

US 2007/0023688 A1    Feb. 1, 2007

(30) Foreign Application Priority Data

Aug. 1, 2005    (KR)    ............... 10-2005-0070325

(51) Int. Cl.
*H01J 37/317*    (2006.01)
*G01N 23/00*    (2006.01)

(52) U.S. Cl. ............... 250/492.21; 250/491.1; 250/492.2; 250/442.11

(58) Field of Classification Search ............ 250/492.21, 250/491.1, 492.2, 442.11
See application file for complete search history.

(56) References Cited

U.S. PATENT DOCUMENTS 5,683,547 A * 11/1997 Azuma et al. ............... 438/695
6,437,350 B1 * 8/2002 Olson et al. ............... 250/492.21
6,573,518 B1 * 6/2003 Renau et al. ............... 250/492.21

FOREIGN PATENT DOCUMENTS

| JP | 05-121933 | 5/1993 |
|---|---|---|
| JP | 06-162975 | 6/1994 |
| JP | 2002-008578 | 1/2002 |
| KR | 0117463 | 2/1998 |
| KR | 2001-0028484 | 4/2001 |
| KR | 2002-0037849 | 5/2002 |
| KR | 2004-0014474 | 2/2004 |
| KR | 2005-0107047 | 11/2005 |

OTHER PUBLICATIONS

English language abstract of Korean Publication No. 0117463.
English language abstract of Korean Publication No. 2001-0028484.
English language abstract of Korean Publication No. 2002-0037849.

* cited by examiner

*Primary Examiner*—Nikita Wells
(74) *Attorney, Agent, or Firm*—Marger Johnson & McCollom, P.C.

(57) ABSTRACT

In an embodiment, an ion beam profiler center measuring apparatus is releasably mounted to the ion beam profiler and measures a center position of an ion beam profiler using a laser beam. Accurate data for a profiler center position may be obtained without direct contact with a platen. A procedure to measure and adjust a center position of the ion beam profiler may be easily performed regardless of an operator's dexterity, requiring relatively little time.

22 Claims, 7 Drawing Sheets

APPARATUS FOR MEASURING A POSITION OF AN ION BEAM PROFILER AND A METHOD FOR ITS USE

CROSS-REFERENCE TO RELATED APPLICATIONS

This application hereby claims priority under 35 U.S.C. § 119 to Korean Patent Application 2005-70325 filed on Aug. 1, 2005, of which the entire contents are hereby incorporated herein by reference.

BACKGROUND

1. Field of the Invention

The present invention relates to an ion implanter, and more particularly, to an apparatus for measuring a position of an ion beam profiler and a method of its use.

2. Description of the Related Art

Semiconductor manufacturing generally includes an ion implanting process that implants conductive impurities into a semiconductor wafer. This process uses an ion beam generated by an ion source. In a general ion implanter, impurities are ionized from an ion source, and these impurity ions are then accelerated to form an ion beam having a predetermined energy. The intensity and direction of the accelerated beam are controlled, so that the beam is implanted into the surface of a wafer. At this point, a conductive region corresponding to the energy of the ion beam may be formed in the wafer.

The energy of an ion contained in a beam is a crucial factor determining a travel depth within a semiconductor wafer before the ion is implanted into the wafer's semiconductor lattice. Recipes for a given integrated circuit device call for ion implanting using various ion species, energies, and doses. Therefore, when one parameter of an ion beam changes, other parameters in turn change. These changes often require a modification of the ion implanter. Also, preventive maintenance of the ion implanter is important to optimize transmission and transfer of the beam to the wafer.

Generally, during the set up or preventive maintenance of the ion implanter, an operator measures and examines the position of the center of a beam profiler to set parameters for a predetermined recipe in connection with a new beam profile of an ion implanter, which takes much time. For example, it often takes more than fifteen minutes for an experienced operator to set an ion implanter into an operable state. The ion implanter cannot perform an ion implanting process while the ion implanter is being set, so that equipment downtime occurs.

A general ion implanter includes an end station. The end station includes a platen for supporting a wafer, a tilt mechanism for tilt adjustments of the platen in X-axis and Y-axis directions, and a measurement system for measuring a parallel state and a direction of a beam. Also, the end station further includes a Faraday beam profiler located adjacent to the platen. The beam profiler allows a scanned ion beam to perform a translational motion parallel to the surface of the wafer. Therefore, uniformity of the scanned ion beam is determined by allowing the beam profiler to perform a translational motion across a plane of the wafer while monitoring a beam current.

As partly described above, a general ion implanter performs tilt mechanism correction and then senses an angle of an ion beam using a beam profiler and a Faraday cup to adjust the uniformity and direction of the ion beam. However, even when the sensed beam angle is compatible with a standard of a predetermined recipe, equipment tends to drift over time, causing errors that are detected when the beam angle is measured again during a subsequent process. Therefore, the position of the center of the beam profiler needs to be examined after the tilt mechanism correction.

For example, a high current or medium current ion implanter manufactured by Varian Semiconductor Equipment uses a jig set to measure and examine the center position of a beam profiler during set up (or prevention maintenance) after a tilt mechanism correction.

The jig set includes a body mounted in a slit provided to a profiler, a pendulum vertically falling to a platen's lower end that adjusts tilt of the platen through a thread coupled to a hole formed in one end of the body, and a ruler for contacting the platen to measure a distance between the thread and an outer periphery of the platen.

However, the above-described ion implanter performs platen tilt correction and then examines the center position of a profiler. At this point, because a chamber space of an end station is narrow, it is difficult to mount a jig set and check an exact position of the pendulum. Also, it is difficult to check center data during center examination. Also, since part of the jig set, namely a ruler, may directly contact the platen, there is a high possibility that scratches are generated on the surface of the platen. Also, since the outer periphery of the platen contacting the vertical surface of the ruler is a curved surface, it is difficult to measure exact center data.

SUMMARY

Embodiments provide an apparatus for measuring a center position of a beam profiler in a fast, accurate, and easy manner.

Embodiments also provide an apparatus for measuring a center of a beam profiler using a laser.

Embodiments also provide an apparatus for measuring center data of a beam profiler accurately and easily.

Embodiments also provide an ion implanter and a method thereof using an apparatus for easily measuring a center of a beam profiler.

In an embodiment, the apparatus for measuring a center of a beam profiler uses a laser. The apparatus for measuring the center of the beam profiler using the laser may measure the center fast and accurately, while preventing scratches on a platen.

Embodiments provide an apparatus for measuring a center position of a beam profiler for an ion implanter having a platen for supporting a wafer, a tilt mechanism for tilt adjustment of the platen, and the beam profiler for detecting a direction of an ion beam scanned on the wafer, the apparatus including: a body having one end mounted on and separable from the beam profiler; a light-emitting unit provided to the other end of the body, for generating a laser from a lower surface of the light-emitting unit to a center position provided to one side of the tilt mechanism, wherein the lower surface of the light-emitting unit and one side of the tilt mechanism are perpendicular to each other.

In other embodiments, the light-emitting unit includes: a laser pointer for generating the laser; a housing for mounting the laser pointer therein; a fixing member for fixing and separating the laser pointer in and from the housing; and a switch for electrically switching the laser pointer to generate or cut off the laser, wherein the housing includes a laser hole formed in a center of the lower surface and through which the laser is emitted.

The switch may include a screw type switch.

In still other embodiments, the housing further includes a switch fixing part for fixing the switch, and the switch fixing part prevents the switch from being separated from the housing when the switch is turned-off.

In still other embodiments, the laser pointer includes a light source for generating the laser, a battery for supplying a power source to the light source, and a cap opened to allow the battery to be replaced.

One side of the tilt mechanism may include a center marking part for marking the center position.

One side of the tilt mechanism may be one side of a Y-axis tilt driving device of the platen.

The apparatus may determine a center position of the beam profiler as normal when the laser coincides with the center position.

Some embodiments provide an ion implanter having a measurement apparatus using a laser. The ion implanter according to the present invention allows position measurement of center data of a beam profiler to be performed fast, accurately, and easily.

Also, some embodiments provide an ion implanter including: a beam profiler provided to the ion implanter; a platen for loading a wafer; a tilt mechanism for tilt adjustment of the platen; a beam profiler measuring apparatus inserted into and separated from the beam profiler, for generating a laser to one side of the tilt mechanism to measure a center position of the beam profiler; and a controller for horizontally moving the beam profiler and updating data regarding the measured center position as center data of the beam profiler.

In other embodiments, the beam profiler measuring apparatus includes: a body having one end mounted on and separated from the beam profiler; a light-emitting unit provided to the other end of the body, for generating a laser from a lower surface of the light-emitting unit to a center position provided to one side of the tilt mechanism, wherein the lower surface of the light-emitting unit and one side of the tilt mechanism are perpendicular to each other.

Embodiments provide a method of measuring a position of a center of a beam profiler using a beam profiler center measuring apparatus for an ion implanter, the method including: moving the beam profiler to a center position of a platen; mounting the beam profiler center measuring apparatus to the beam profiler; turning on a laser pointer of the beam profiler center measuring apparatus to generate a laser to one side of a tilt mechanism; determining whether the generated laser coincides with a center position provided on one side of the tilt mechanism; and regarding a center position of the beam profiler as normal when the laser coincides with the center position provided on one side of the tilt mechanism.

In other embodiments, the method further includes adjusting a position of the beam profiler when the laser does not coincide with the center position.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
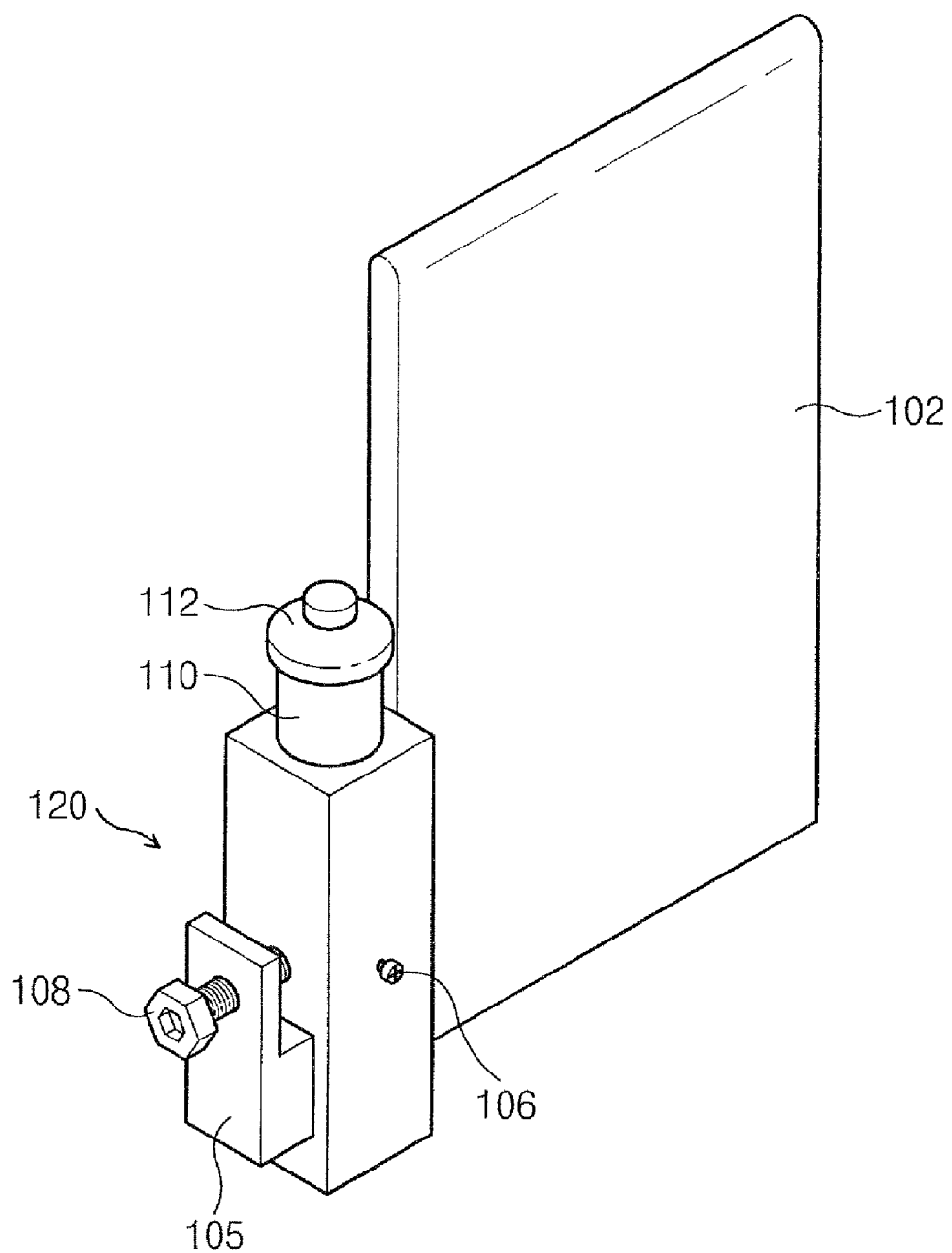
FIG. 1 is a perspective view of a beam profiler center measuring apparatus according to an embodiment.

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the shapes of elements are exaggerated for clarity.

Figure 2A:
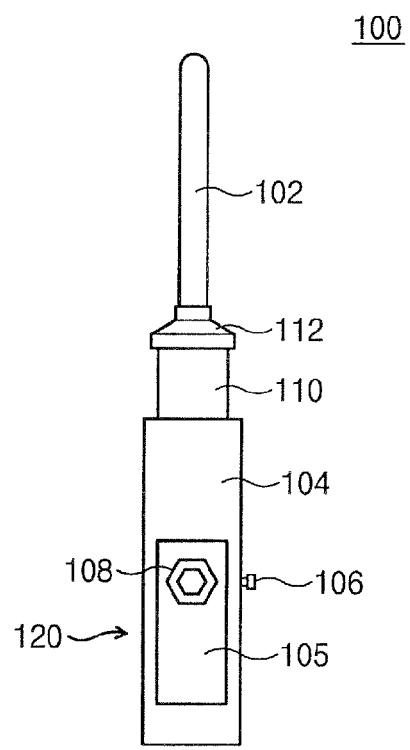
FIGS. 2A through 2C are elevation and plan views of the beam profiler center measuring apparatus illustrated in FIG. 1.
Figure 2B:
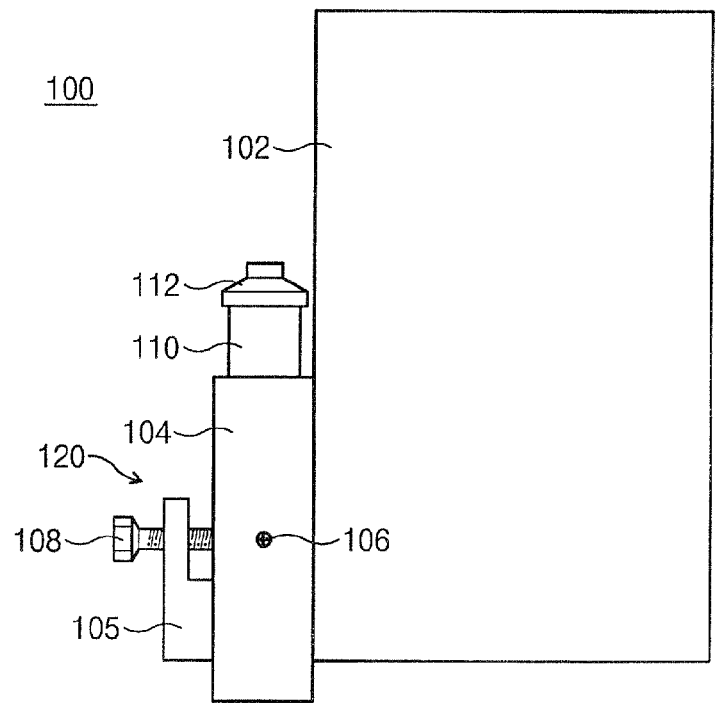
Figure 2C:
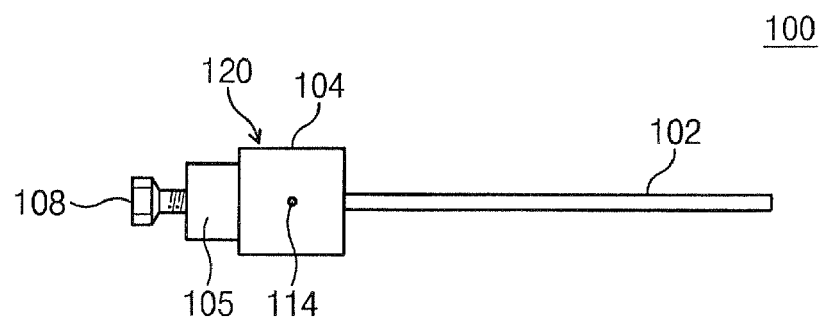

FIG. 1 is a perspective view of a beam profiler center measuring apparatus according to an embodiment, and FIGS. 2A through 2C are elevation and plan views of the beam profiler center measuring apparatus illustrated in FIG. 1.

Referring to FIG. 1, the beam profiler center measuring apparatus 100 is provided as a jig for measurement, and includes a body 102 that can be mounted on and separated from a beam profiler provided to an end station of an ion implanter, and a light-emitting unit 120 for generating a laser to measure a center position of the beam profiler. Here, the ion implanter is a medium current ion implanter.

The beam profiler center measuring apparatus 100 (referred to as a jig) allows an adjustment and check of a center position of the beam profiler using a laser, for example, during set up or preventive maintenance (PM) of an ion implanter.

In detail, referring to FIGS. 2A through 2C, the jig 100 has an end that can be inserted into an aperture, for instance a hole or slot, of a beam profiler of an end station. The other end is where the light-emitting unit 120 is provided. The body 102 and the light-emitting unit 120 may be integrally formed.

The light-emitting unit 120 includes a housing 104 in which a laser pointer 110 is mounted, a fixing member 106 for fixing the laser pointer 110 to the housing 104, and a switch 108 for electrically turning on and off the laser pointer 110. A laser hole 114, shown in FIG. 2C may be formed in a center of a lower surface of the housing 104 so that a laser beam is emitted to the outside.

The switch 108 may include a screw type switch, for example, to maintain a switch-on state.

The laser pointer 110 may be inserted into, or separated from, the housing 104, which may include a switch fixing part 105 for preventing the switch 108 from being separated from the housing 104 when the switch is turned off.

The switch fixing part 105 may be integrally formed with the housing 104 to prevent the switch 108 from being separated from the housing 104 when the switch 108 is turned on and off as the switch 108 horizontally rotates.

The fixing member 106 may be provided as a screw, for example, to allow easy replacement of the laser pointer 110.

Figure 3:
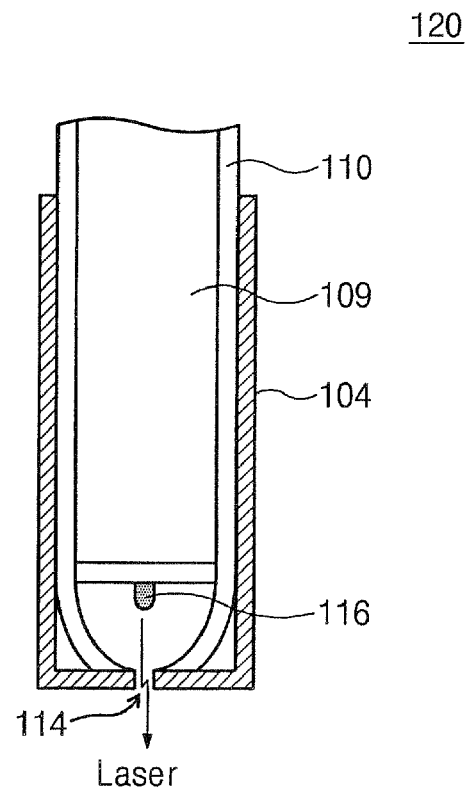
FIG. 3 is a cross-sectional view of an inner construction of a light-emitting unit of the beam profiler center measuring apparatus illustrated in FIG. 1.

Referring to FIG. 3, a battery (not shown) for supplying power may be mounted in an inside 109 of the laser pointer 110, which includes a light source 116 for receiving power from the battery and generating a laser, and an electrical circuit (not shown) for connecting the battery, the light source 116, and the switch 108. Also, the light source 116 may be located to face the laser hole 114 formed in the center of the lower surface of the laser pointer 110. That is, a lower surface of the housing 104 and one side of a tilt mechanism are perpendicular to each other, and the laser hole 114 may be formed in the center of the lower surface of the housing 104, so that a laser is always projected perpendicularly, and thus accurate settings are achieved even when the laser pointer 110 is replaced.

Also, the laser pointer 110 may include a cap 112 formed on an upper end of the laser pointer 110 to allow replacement of a battery. The cap 112 may be opened to replace a battery (e.g., a mercury battery or a dry battery).

Figure 4:
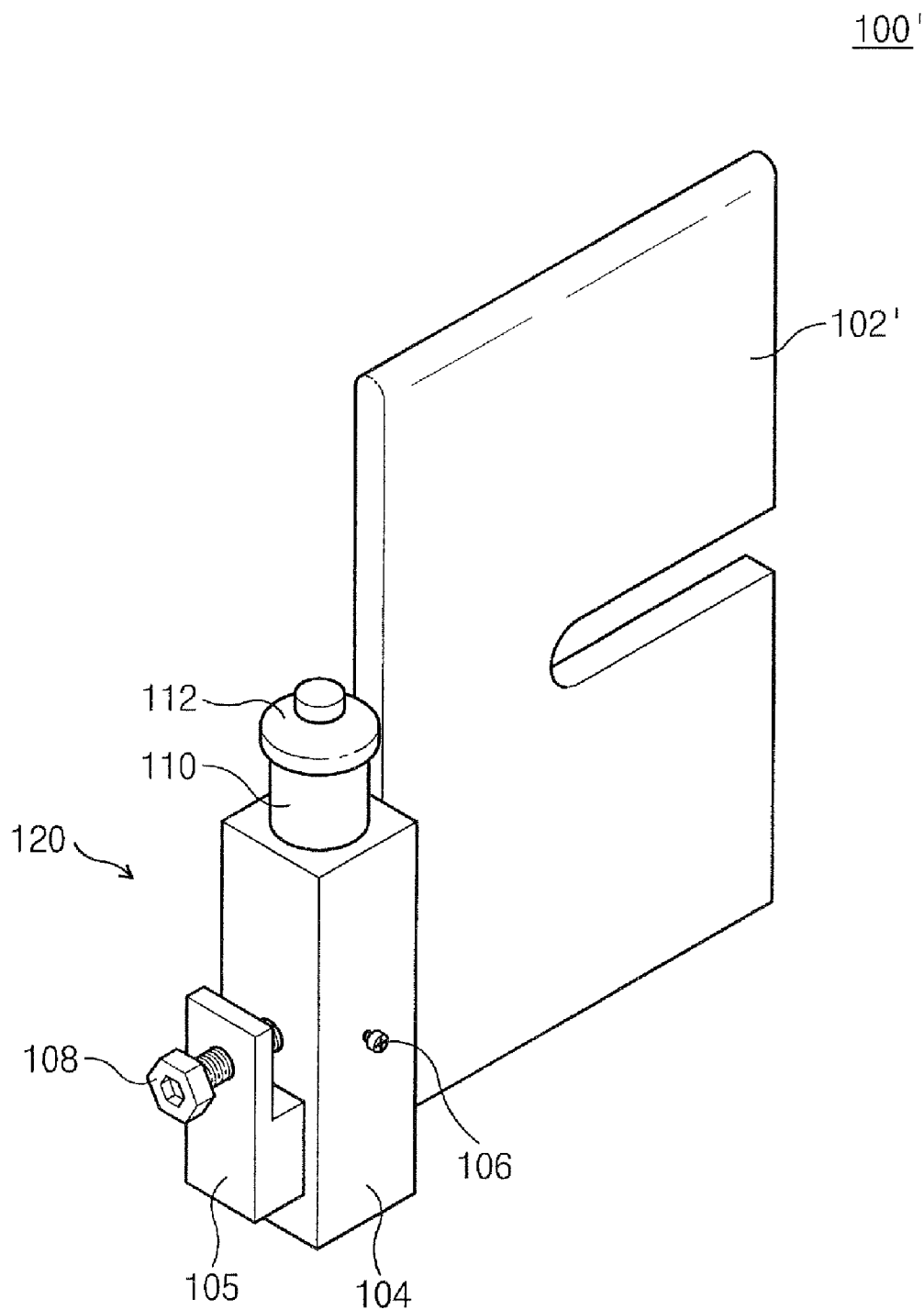
FIG. 4 is a perspective view of a beam profiler center measuring apparatus according to another embodiment.

In other embodiments, a beam profiler center measuring apparatus 100' (jig), shown in FIG. 4, is suitable for a high current ion implanter. That is, the jig 100' is a modification in size and shape of the jig 100 and the body 102 of FIG. 1. Accordingly, the jig 100' includes the same elements 104 through 120 as those of the jig 100 illustrated in FIGS. 1 and 2A-2C. Since the elements 104 through 120 have the same functions as those of the elements illustrated in the earlier figures described above, detailed descriptions thereof will be omitted.

Therefore, since the beam profiler center measuring apparatuses 100 or 100', according to the embodiments, use a laser, and thus do not have a portion directly contacting a platen (or an electrostatic chuck), scratches generated on the platen may be fundamentally prevented. Also, the embodiments reduce time needed for set up or PM by reducing the time needed for measuring center data for a beam profiler.

A method of measuring a beam profiler center of an ion implanter of a high current or medium current using a jig of the above-described embodiments will now be illustrated.

Figure 5:
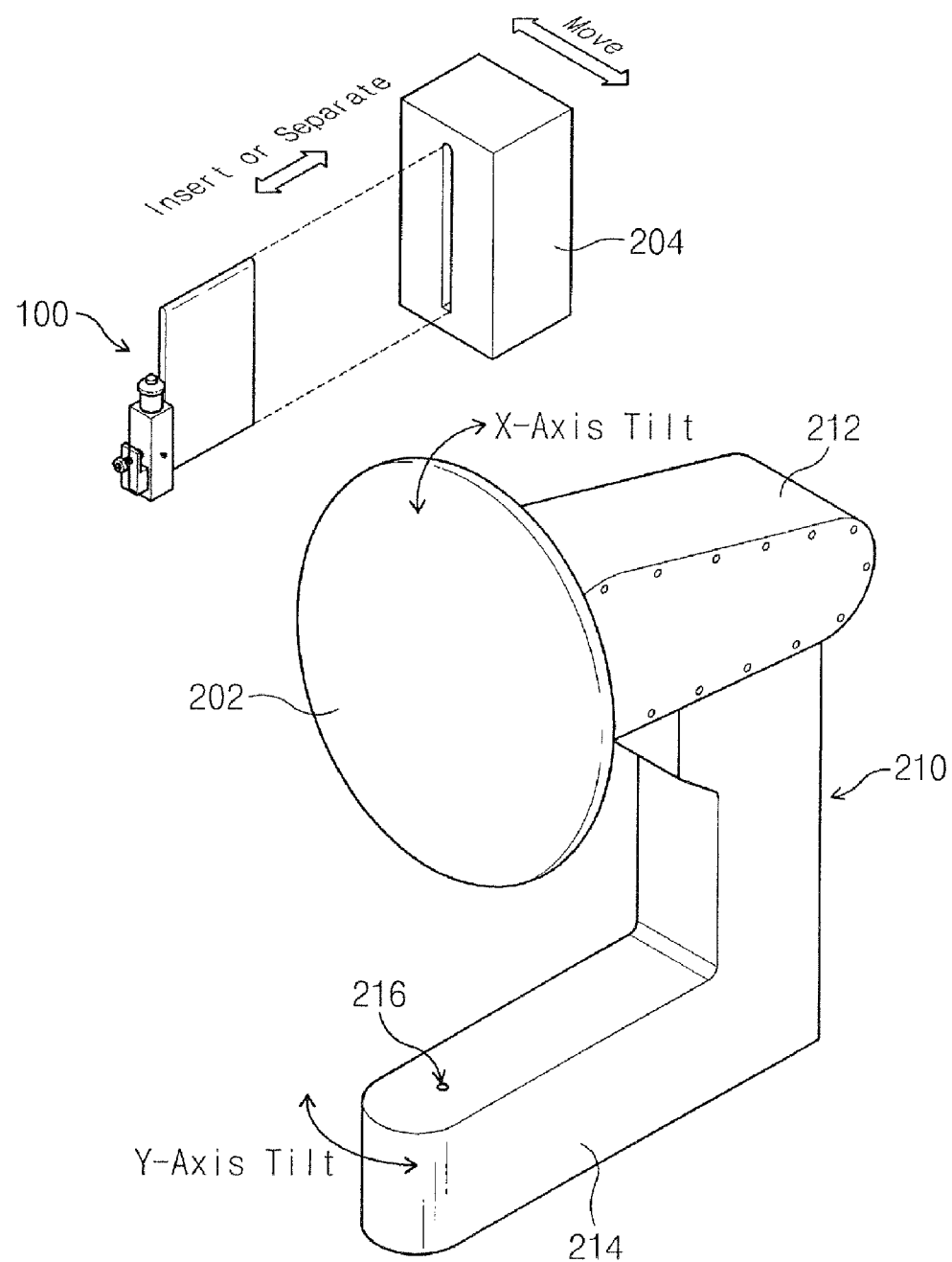
FIG. 5 is a perspective view illustrating part of an ion implanter using a beam profiler center measuring apparatus of FIG. 1 according to an embodiment.
Figure 6:
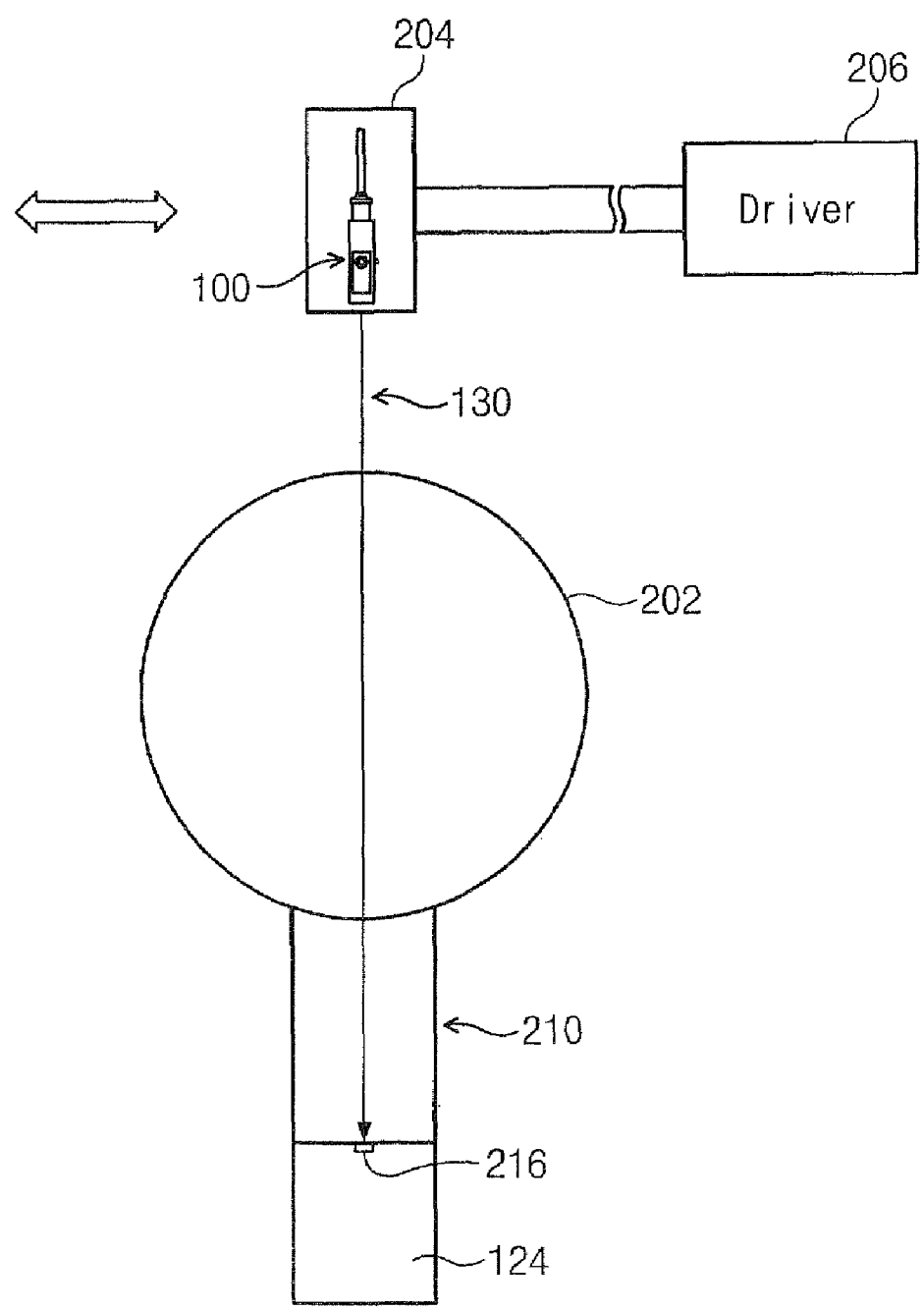
FIG. 6 is an elevation view illustrating a state in which a beam profiler center of the ion implanter illustrated in FIG. 5 is measured.

FIGS. 5 and 6 are perspective views illustrating part of an ion implanter 200 using a beam profiler center measuring apparatus 100 or 100' according to the embodiments. Here, part of an end station of the ion implanter 200 is illustrated.

Referring to FIGS. 5 and 6, the ion implanter 200 includes a beam profiler 204, a platen 202 (or an electrostatic chuck) for loading a wafer, and a tilt mechanism 210 for tilt adjustment of the platen 202. The tilt mechanism 210 includes an X-axis tilt adjustment driving device 212 and a Y-axis tilt adjustment driving device 214. A center marking part 216 may be provided on one side of the Y-axis tilt adjustment driving device 214, for example, a surface of the Y-axis tilt adjustment driving device 214 that faces the beam profiler 204. The center marking part 216 may be located at the axis of rotation of the Y-axis tilt adjustment driving device 214. Therefore, a laser beam 130 (shown in FIG. 6) generated from a laser pointer of the beam profiler center measuring apparatus 100' mounted in a hole or slot of a beam profiler 204 may reach the center marking part 216 perpendicularly. At this point, when a destination point of the laser 130 coincides with the center marking part 216, it is determined that the beam profiler 204 is set at a center position.

However, when the destination point of the laser 130 does not coincide with the center marking part 216, a driver 206 (or controller) may horizontally move the beam profiler 204 to adjust the center position of the beam profiler 204. The driver 206 may utilize data, herein referred to as adjusted center data, to make these position adjustments. The adjusted center data of the driver 206 may be updated as needed for subsequent processes.

Figure 7:
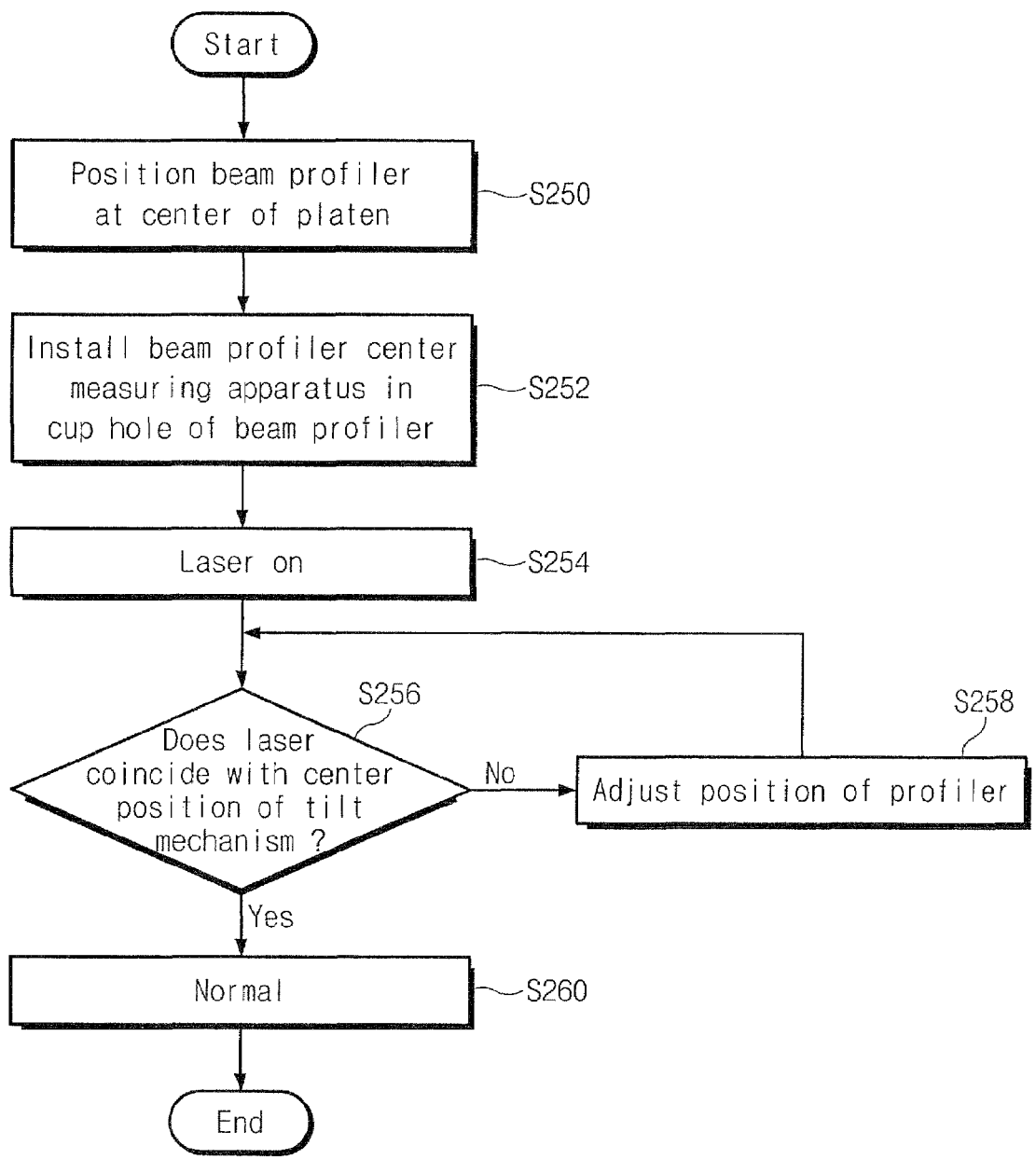
FIG. 7 is a flowchart illustrating a method of adjusting, at an ion implanter, a beam profile center using a beam profiler center measuring apparatus.

FIG. 7 is a flowchart illustrating a method of adjusting, at an ion implanter of the embodiments, a beam profile center using a beam profiler center measuring apparatus. This method is performed during set up or PM of an ion implanter. The method may be performed after tilt adjustment of a platen is completed.

Referring to FIG. 7, in operation S250, a beam profiler may be positioned at a center of a platen. In operation S252, a beam profiler center measuring apparatus may be installed in a hole or slot of the beam profiler. In operation S254, a laser pointer may be turned on to emit a laser beam to one side of a tilt mechanism, and may be parallel to a surface of the platen or the surface of the mounted wafer. The laser may be emitted perpendicularly toward a center marking part provided on one side of the tilt mechanism to correspond to a center position of the platen. That is, since a laser hole may be provided perpendicularly to one side of the tilt mechanism, the laser may always be perpendicularly emitted to one side of the tilt mechanism.

In operation S256, whether the emitted laser beam coincides with the center marking part provided on one side of the tilt mechanism may be determined. When the laser beam coincides with the center marking part as a result of the determination, operation S260 may be performed to determine if a position of the profiler center is normal. However, when the laser beam does not coincide with the center marking part as a result of the determination, operation S258 may be performed to adjust the position of the profiler, and then operation S256 may thereafter be performed. While adjusting the position of the profiler, the laser beam may be "swept" through a plane that is parallel to the surface of the platen or mounted wafer, until the laser beam position is adjusted to coincide with the center marking part, for example.

As described above, the ion implanter according to the embodiments uses a laser to measure a center of a beam profiler. The measuring apparatus is simple, allowing work efficiency to improve. For example, a conventional process of measuring a center of a beam profiler may take about fifteen minutes, while the time taken for measuring a center of a beam profiler is about two minutes according to the embodiments. Also, the measuring apparatus may be operated by an operator according to a manual (e.g., standard operation procedure (SOP) or a one-point lesson sheet (OPLS)) regardless of the operator's dexterity. Modifications of the measuring apparatus are made in size and shape to be compatible with a variety of ion implanters, so that the measuring apparatus may be applied to ion implanters of a high current and of a medium current.

It will be apparent to those skilled in the art that various modifications and variations can be made in the embodiments. Thus, it is intended that the present invention covers the modifications and variations of this invention provided they come within the scope of the appended claims and their equivalents.

What is claimed is:

1. An apparatus for measuring a position of an ion beam profiler with respect to an ion implanter of a type having a wafer support surface and a tilt mechanism used to adjust the tilt of the support surface, the apparatus comprising:
    a body being releasably mountable to said ion beam profiler; and
    a light-emitting unit fixed to the body for generating a laser beam adapted to coincide with a position mark located on a surface of the tilt mechanism.

2. The apparatus of claim 1, wherein said body ion beam profiler is of a type having an aperture formed therein, wherein said body is slidably receivable within said aperture.

3. The apparatus of claim 1, wherein the light-emitting unit comprises:
    a laser pointer for generating a laser beam;

a housing for mounting the laser pointer therein;

a fixing member for fixing and separating the laser pointer in and from the housing; and a switch for electrically switching the laser pointer to generate or cut off the laser beam, wherein the housing includes a laser hole formed in a surface and through which the laser is emitted.

4. The apparatus of claim 3, wherein the switch comprises a screw-type switch.

5. The apparatus of claim 4, wherein the housing further includes a switch fixing part for fixing the switch, and the switch fixing part prevents the switch from being separated from the housing when the switch is turned-off.

6. The apparatus of claim 3, wherein the laser pointer comprises:

a light source for generating the laser beam;

a battery for supplying a power to the light source; and a cap opened to allow the battery to be replaced.

7. The apparatus of claim 3, wherein the laser beam is parallel to an axis of rotation of the tilt mechanism.

8. The apparatus of claim 3, further comprising a center marking part disposed on a surface of the tilt mechanism, onto which the laser beam impinges when the ion beam profiler is in a center position.

9. The apparatus of claim 3, wherein the ion beam profiler is moveable so that the laser beam moves is a plane parallel to the surface of the platen.

10. An ion implanter comprising:

an ion beam profiler;

a platen for mounting a wafer;

a tilt mechanism for adjusting the tilt of the platen;

an ion beam profiler measuring apparatus inserted into, and separable from, the ion beam profiler, for generating a laser beam to impinge on a predetermined position on one side of the tilt mechanism to measure a center position of the ion beam profiler; and a controller for moving the ion beam profiler and updating data regarding the measured center position as center data of the beam profiler.

11. The ion implanter of claim 10, wherein the ion beam profiler measuring apparatus comprises:

a body having one end mounted on, and separable from, the beam profiler; and a light-emitting unit provided to the other end of the body, for generating the laser beam perpendicularly from a surface of the light-emitting unit to the predetermined position, wherein the surface of the light-emitting unit and the one side of the tilt mechanism are parallel to each other.

12. The ion implanter of claim 11, wherein the light-emitting unit comprises:

a laser pointer for generating the laser beam;

a housing for mounting the laser pointer;

a fixing member for fixing and separating the laser pointer in and from the housing; and a switch for electrically switching the laser pointer to generate or cut off the laser beam, wherein the housing includes a laser hole formed in the lower surface of the light-emitting unit and through which the laser beam is emitted.

13. The ion implanter of claim 12, wherein the switch comprises a screw type switch.

14. The ion implanter of claim 13, wherein the housing further includes a switch fixing part for fixing the switch, and the switch fixing part prevents the switch from being separated from the housing when the switch is turned-off.

15. The ion implanter of claim 12, wherein the laser pointer comprises:

a light source for generating the laser beam;

a battery for supplying a power source to the light source; and a cap that is openable to allow the battery to be replaced.

16. The ion implanter of claim 11, wherein the predetermined position is an axis of rotation of the tilt mechanism.

17. The ion implanter of claim 11, wherein the tilt mechanism comprises a Y-axis tilt driving device and an X-axis tilt driving device.

18. The ion implanter of claim 10, wherein the ion beam profiler measuring apparatus is adapted to determine a center position of the beam profiler as normal when the laser beam coincides with the predetermined position.

19. The ion implanter of claim 18, wherein the ion beam profiler measuring apparatus is adapted to adjust a position of the ion beam profiler when the laser does not coincide with the predetermined position.

20. A method of measuring a position of a center of an ion beam profiler using an ion beam profiler center measuring apparatus for an ion implanter, the method comprising:

moving the ion beam profiler to a center position of a platen;

mounting the ion beam profiler center measuring apparatus to the ion beam profiler;

turning on a laser pointer of the ion beam profiler center measuring apparatus to generate a laser beam to impinge onto one side of a tilt mechanism;

determining whether the generated laser beam coincides with a center position provided on the one side of the tilt mechanism; and regarding a position of the ion beam profiler as centered when the laser beam coincides with the center position provided on the one side of the tilt mechanism.

21. The method of claim 20, further comprising adjusting a position of the ion beam profiler when the ion beam profiler is not centered.

22. The method of claim 20, wherein the ion beam profiler including an aperture, and the measuring apparatus including a body, the step of mounting the ion beam profiler center measuring apparatus to the ion beam profiler further comprising inserting the body into the aperture.

* * * * *

UNITED STATES PATENT AND TRADEMARK OFFICE
CERTIFICATE OF CORRECTION

PATENT NO.        : 7,462,846 B2                                          Page 1 of 1
APPLICATION NO.   : 11/461702
DATED             : December 9, 2008
INVENTOR(S)       : Jung-Su Park It is certified that error appears in the above-identified patent and that said Letters Patent is hereby corrected as shown below:

Column 8, line 28, the words "ad just" should read -- adjust --.

Signed and Sealed this

Seventeenth Day of February, 2009

JOHN DOLL
*Acting Director of the United States Patent and Trademark Office*